(12) United States Patent
Gambe

(10) Patent No.: US 9,376,267 B2
(45) Date of Patent: Jun. 28, 2016

(54) ORIENTATION ADJUSTMENT DEVICE AND ORIENTATION ADJUSTMENT METHOD

(75) Inventor: Masahiko Gambe, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 269 days.

(21) Appl. No.: 14/114,785

(22) PCT Filed: Mar. 13, 2012

(86) PCT No.: PCT/JP2012/001735
§ 371 (c)(1),
(2), (4) Date: Oct. 30, 2013

(87) PCT Pub. No.: WO2012/150645
PCT Pub. Date: Nov. 8, 2012

(65) Prior Publication Data
US 2014/0321958 A1    Oct. 30, 2014

(30) Foreign Application Priority Data

May 2, 2011   (JP) .................................. 2011-102723

(51) Int. Cl.
| | | |
|---|---|---|
| H01L 21/683 | (2006.01) | |
| B65G 47/24 | (2006.01) | |
| H01L 21/677 | (2006.01) | |

(52) U.S. Cl.
CPC .......... *B65G 47/24* (2013.01); *H01L 21/67769* (2013.01); *H01L 21/67772* (2013.01); *H01L 21/67775* (2013.01)

(58) Field of Classification Search
CPC .............. B65G 47/24; H01L 21/67769; H01L 21/67775; H01L 21/67772; H01L 21/67778
USPC .......................... 414/754, 816, 783; 206/710
See application file for complete search history.

(56) References Cited

U.S. PATENT DOCUMENTS 5,944,475 A * 8/1999 Bonora ............. H01L 21/67772
                                                          414/222.02
6,082,949 A * 7/2000 Rosenquist ....... H01L 21/67772
                                                             414/217
(Continued)

FOREIGN PATENT DOCUMENTS

JP      2005-221618 A    8/2005

OTHER PUBLICATIONS

English translation of Official Communication issued in corresponding International Application PCT/JP2012/001735, mailed on Nov. 7, 2013.

(Continued)

*Primary Examiner* — Saul Rodriguez
*Assistant Examiner* — Lynn Schwenning
(74) *Attorney, Agent, or Firm* — Keating & Bennett, LLP

(57) ABSTRACT

A clean stocker includes an orientation adjustment device that includes a pivot device which pivots a placing base, a reticle carrier device which holds an article without changing an orientation of the article, and a controller which controls the pivot device and the reticle carrier device. The controller is programmed to cause the article to be held in a state in which the article is separate from the placing base held by the pivot device, the placing base in the state in which the article is separate therefrom to be pivoted from an initial position to an intended position, the article to be placed on the placing base which has been pivoted to the intended position, and the placing base having the article placed thereon to be pivoted from the intended position to the initial position.

4 Claims, 9 Drawing Sheets

(56) References Cited

U.S. PATENT DOCUMENTS

| | | | | |
|---|---|---|---|---|
| 6,338,409 | B1 * | 1/2002 | Neary | G03F 1/66 206/454 |
| 6,393,334 | B1 * | 5/2002 | Lewis | H01L 21/67379 700/117 |
| 7,245,350 | B2 * | 7/2007 | Mochizuki | G03F 7/70741 355/30 |
| 7,450,219 | B2 * | 11/2008 | Matsutori | G03F 1/66 206/710 |
| 7,462,011 | B2 * | 12/2008 | Yamazaki | H01L 21/67069 118/500 |
| 7,695,239 | B2 * | 4/2010 | Wu | H01L 21/67766 294/119.1 |
| 2004/0227924 | A1 | 11/2004 | Willems Van Dijk et al. | |
| 2008/0023417 | A1 | 1/2008 | Yamamoto | |
| 2008/0260502 | A1 * | 10/2008 | Aburatani | H01L 21/67769 414/226.04 |

OTHER PUBLICATIONS

Official Communication issued in corresponding European Patent Application No. 12779355.2, mailed on Nov. 5, 2014.

English Abstract of KR 10-0774828.

Official Communication issued in International Patent Application No. PCT/JP2012/001735, mailed on Jun. 19, 2012.

\* cited by examiner

ORIENTATION ADJUSTMENT DEVICE AND ORIENTATION ADJUSTMENT METHOD

BACKGROUND OF THE INVENTION

1. Field of the Invention

The present invention relates to an orientation adjustment device that adjusts a relative orientation between an article and a placing base on which the article is placed.

2. Description of the Related Art

Conventional exposure devices fabricate electronic components by transferring circuit patterns written in reticles onto semiconductor devices. Here, the reticle, being housed in a pod for preventing contamination, is inserted into the exposure device. A direction in which the reticle is inserted into the exposure device depends on a model. More specifically, a direction in which the reticle is inserted into the exposure device is predetermined and a direction in which a pod having the reticle housed therein is inserted into the exposure device is also predetermined.

Thus, conventional reticle storages have mechanisms for adjusting the orientation of a reticle in a pod, in accordance with a model of the exposure device. Specifically, there exists a reticle storage which has, as an orientation adjustment device, a mechanism of removing the reticle from the pod in a pod opener, rotating the reticle by a predetermined angle on a turntable, and housing the reticle back in the pod in the pod opener.

According to the above mechanism, however, a need exists to move the reticle from the pod opener to the turntable, and, after rotating the reticle, move the reticle from the turntable back to the pod opener. As a result, there arises a problem that the process of transferring the reticle between the pod opener and the turntable is time consuming.

SUMMARY OF THE INVENTION

Thus, in view of the above problems, preferred embodiments of the present invention provide an orientation adjustment device that adjusts a relative orientation between an article and a placing base on which the article is placed, in a short time and with a few steps.

An orientation adjustment device according to a preferred embodiment of the present invention is a device which adjusts a relative orientation between an article and a placing base where a direction in which the article is inserted into an external device is predetermined and a direction in which the placing base including the article mounted thereon is inserted into the external device is predetermined. Specifically, the orientation adjustment device includes a pivot device arranged to pivot the placing base; a holding device arranged to hold the article without changing an orientation of the article; and a controller arranged and programmed to control the pivot device and the holding device to adjust the relative orientation between the article and the placing base to a predetermined orientation. The controller is programmed to cause: the holding device to hold the article in a state in which the article is separate from the placing base held by the pivot device; the pivot device to pivot the placing base in the state in which the article is separate from the placing base, from an initial position to an intended position; the holding device to place the article on the placing base which has been pivoted to the intended position; and the pivot device to pivot the placing base having the article placed thereon from the intended position to the initial position.

According to the above configuration, unlike conventional configurations, there is no need to transfer an article elsewhere. Thus, an amount of cycle time required for the transfer is significantly reduced. As a result, the relative orientation between the article and the placing base can be adjusted in a short time and with a few steps.

Moreover, the holding device preferably moves vertically, while holding the article, and preferably holds the article in a holding position that is spaced upwardly by a predetermined distance from the placing base. This eliminates the need for a process of positioning the article when placing the article back onto the placing base after the placing base is pivoted. Thus, the orientation can be adjusted in a shorter time and with fewer steps.

Furthermore, the controller is preferably programmed to cause the pivot device to start pivoting the placing base from the initial position to the intended position after the article is separated from the placing base by the holding device and before the article reaches the holding position. By separating the article from the placing base and pivoting the placing base in parallel, the orientation of the article is adjusted in a shorter time and with a fewer steps.

Furthermore, the orientation adjustment device preferably includes an orientation verification device arranged to verify the relative orientation between the article and the placing base. Then, after causing the pivot device to pivot the placing base to the initial position, the controller is preferably programmed to cause the orientation verification device to verify the relative orientation between the article and the placing base. In this manner, the relative orientation between the article and the placing base is verified, which can then be sent on to the subsequent processing.

An orientation adjustment method according to another preferred embodiment of the present invention is a method for adjusting a relative orientation between an article and a placing base, executed by an orientation adjustment device including a pivot device that pivots a placing base, and a holding device that holds the article without changing an orientation of the article when a direction in which the article is inserted into an external device is predetermined and a direction in which the placing base having the article placed thereon is inserted into the external device is predetermined. Specifically, the orientation adjustment method includes: holding, by the holding device, the article in a state in which the article is separate from the placing base held by the pivot device; pivoting, by the pivot device, the placing base in the state in which the article is separate from the placing base, from an initial position to an intended position; and placing, the holding device, the article on the placing base which has been pivoted to the intended position; and pivoting, the pivot device, the placing base having the article placed thereon from the intended position to the initial position.

According to various preferred embodiments of the present invention, unlike conventional devices and methods, there is no need to transfer an article elsewhere. Thus, a relative orientation between the article and the placing base is adjusted in a short time and with few steps.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments according to the present invention will be described, with reference to the accompanying drawings.

Figure 1:
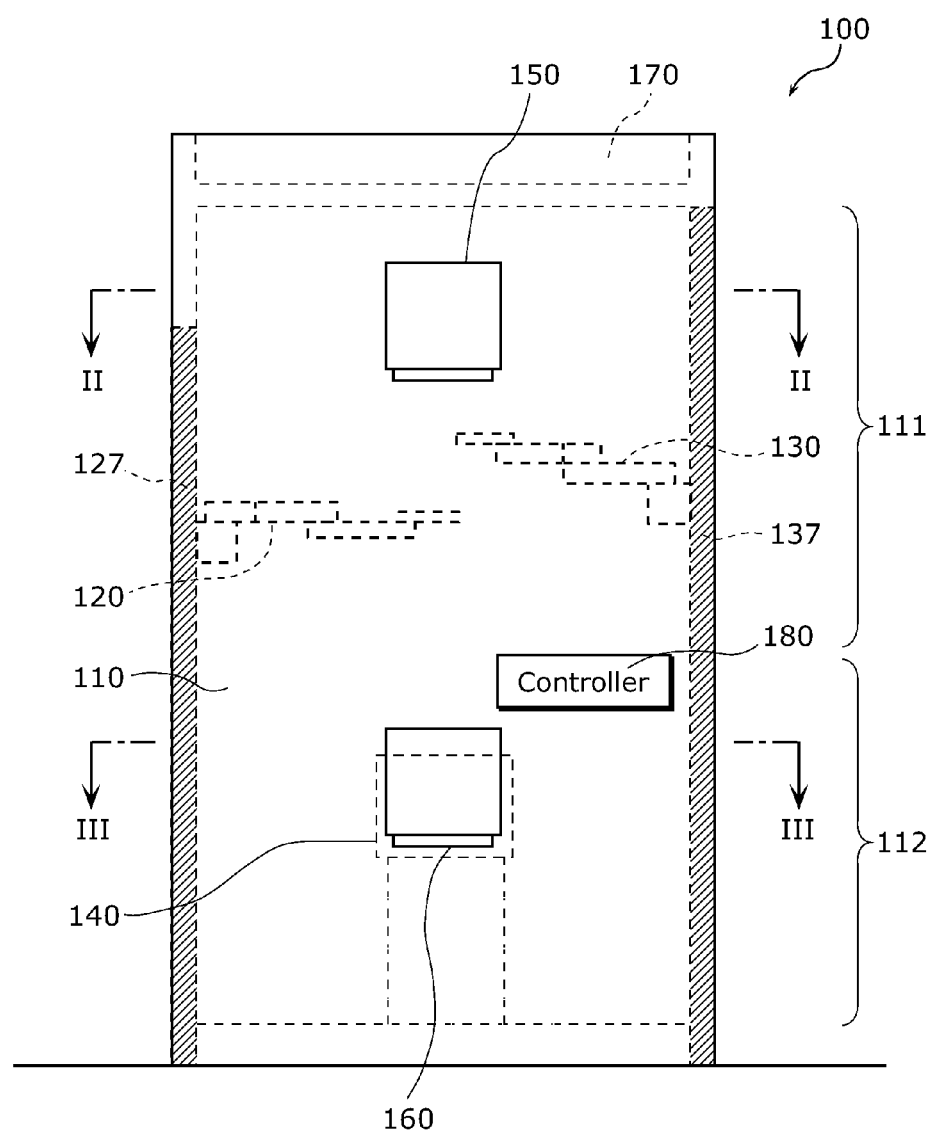
FIG. 1 is a front view of a clean stocker according to a preferred embodiment of the present invention.
Figure 2:
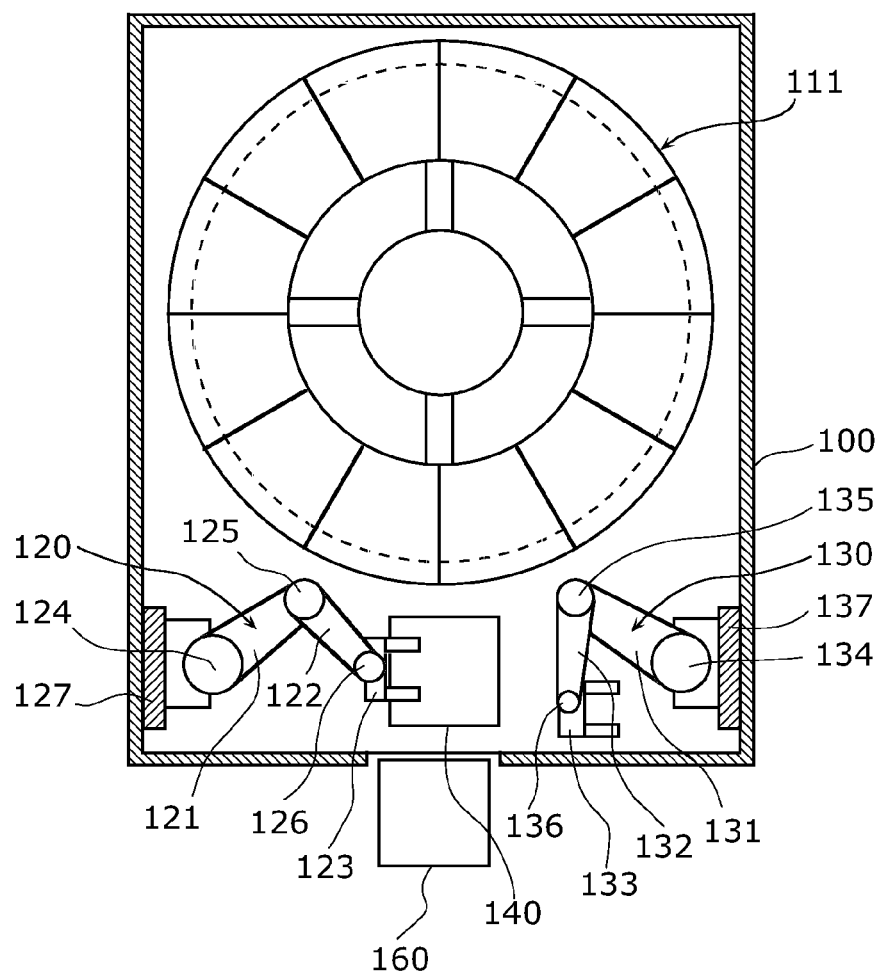
FIG. 2 is a sectional view across II-II of FIG. 1.
Figure 3:
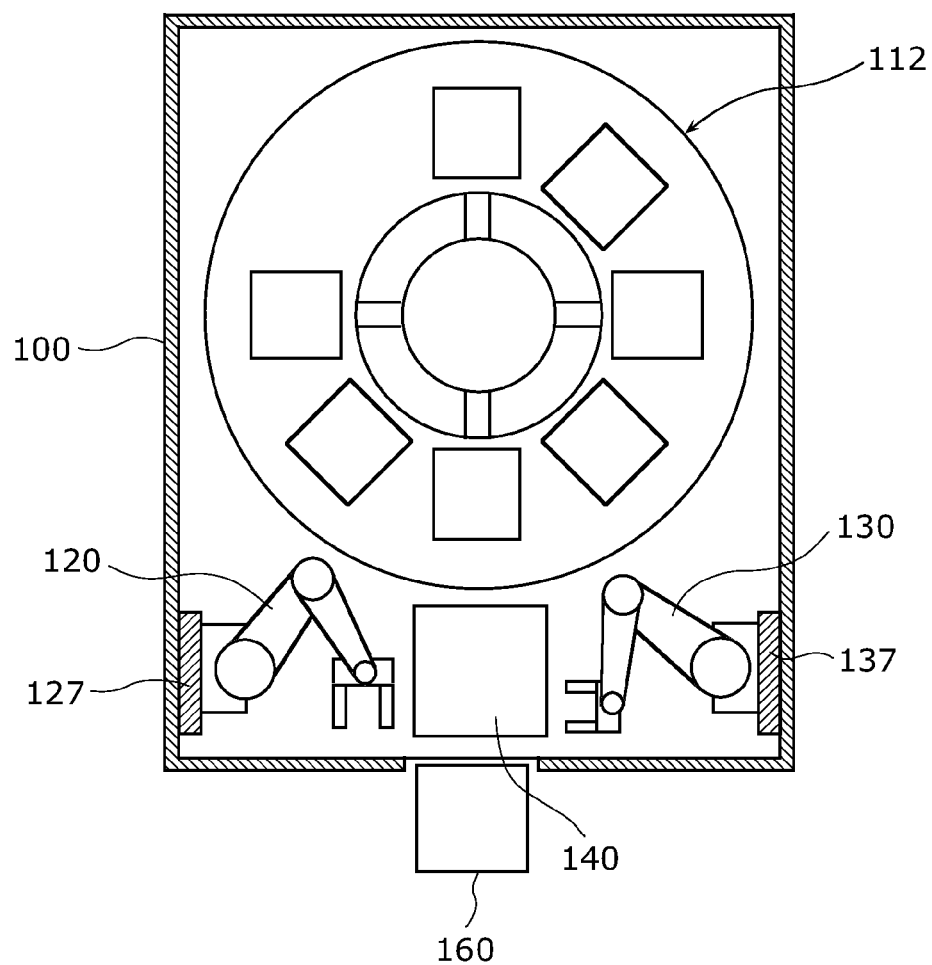
FIG. 3 is a sectional view across III-III of FIG. 1.

First, referring to FIG. 1 to FIG. 3, the configuration of a clean stocker 100 which includes an orientation adjustment device according to the preferred embodiment of the present invention will be described. FIG. 1 is a front view of the clean stocker 100 according to the present preferred embodiment. FIG. 2 is a sectional view across II-II of FIG. 1. FIG. 3 is a sectional view across III-III of FIG. 1.

The clean stocker 100 is preferably installed in a clean room at a semiconductor plant or a liquid crystal plant, for example, and reticles (articles) for exposure, which are used in semiconductor substrates and liquid crystal substrates, and pods (containers), which house the reticles, preferably are separately stored, for example. It is assumed that a direction in which a reticle is inserted into the exposure device (external device) is predetermined and a direction in which a pod having a reticle placed thereon is inserted into the exposure device is predetermined.

Specifically, the clean stocker 100 preferably includes a rotating rack 110, a reticle carrier device 120, a pod carrier device 130, a pod opener 140, an OHT auto load port 150, a manual load port 160, a fan filter unit (FFU) 170, and a controller 180. The rotating rack 110 includes a large number of vertical multi-shelves, and is partitioned into a rotating rack 111 for reticle and a rotating rack 112 for empty pod, starting from the top.

An orientation adjustment device according to one preferred embodiment of the present invention includes, for example, the pod opener 140 (more specifically, a placing unit 142 described below) serving as a pivot device, the reticle carrier device 120 serving as a holding device, and the controller 180, among components of the clean stocker 100. The configuration and the operation of each component will be described below.

The rotating rack 111 for reticle is a rack to store reticles for exposure, which are preferably used in semiconductor substrates and liquid crystal substrates, for example. The rotating rack 112 for empty pod is a rack to store empty pods (Hereinafter, denoted as an "empty pod".) in which no reticles are housed. It should be noted that the number of pods stored in the rotating rack 112 for empty pod may be fewer than the number of reticles stored in the rotating rack 111 for reticle, and may be, for example, about 1/10 to about 1/100 of the number of reticles stored in the rotating rack 111.

The rotating rack 111 for reticle and the rotating rack 112 for empty pod each may rotate as a unit and each shelf may be limited so as not to rotate independently. Alternatively, to rapidly retrieve and store the contents, each shelf may further be partitioned into vertically disposed blocks, and each block may independently rotate.

The reticle carrier device 120 is installed to one side (on the left side in FIG. 1) on a front surface of the interior of the clean stocker 100. The reticle carrier device 120, for example, carries a reticle between the rotating rack 111 for reticle and the pod opener 140, and moves a position of a reticle in the pod opener 140.

More specifically, the reticle carrier device 120 is two-stage arm 121 and 122 including a hand 123 on an end, and includes three joints 124, 125, and 126 which operate in a horizontal plane. The reticle carrier device 120 ascends and descends along with an ascending and descending guide 127. Specifically, the reticle carrier device 120 ascends and descends within a range of the ascending and descending guide 127, and causes each of the joints 124, 125, and 126 to operate independently, thus carrying a reticle in any direction within reach of the two-stage arm 121 and 122.

The pod carrier device 130 is installed to the other side (on the right side in FIG. 1) on the front surface of the interior of the clean stocker 100. The pod carrier device 130, for example, carries an empty pod between the rotating rack 112 for empty pod and the pod opener 140, and carries a pod having a reticle housed therein (hereinafter, denoted as a "pod containing a reticle") between the pod opener 140 and the OHT auto load port 150 and between the pod opener 140 and the manual load port 160.

More specifically, the pod carrier device 130 includes a two-stage arm 131 and 132 including a hand 133 on an end, and includes three joints 134, 135, and 136 which operate in a horizontal plane. The pod carrier device 130 ascends and descends along with an ascending and descending guide 137. Specifically, the pod carrier device 130 ascends and descends within a range of the ascending and descending guide 137, and causes each of joints 134, 135, and 136 to operate independently, thus carrying a pod in any direction within reach of the two-stage arm 131 and 132.

The pod opener 140 preferably is disposed at a front central portion of the interior of the clean stocker 100, i.e., between the reticle carrier device 120 and the pod carrier device 130. The pod opener 140 is used to, for example, house a reticle into an empty pod, remove the reticle from the pod containing the reticle, and adjust a relative orientation between the reticle and the pod. Details of the processing will be described below.

The OHT auto load port 150 is a load port for an overhead traveling vehicle, disposed in a front upper portion of the clean stocker 100, and is an interface through which a pod containing a reticle is stored/retrieved into/from an overhead traveling vehicle (not shown). The manual load port 160 is a load port for an operator, disposed in a front lower portion of the clean stocker 100, and is an interface through which an operator stores and retrieves a pod containing a reticle.

The controller 180 is arranged and programmed to control movable units of the clean stocker 100. For example, the controller 180 is programmed to rotate the rotating rack 110 to a predetermined position, and control operations of the reticle carrier device 120 and the pod carrier device 130. The details will be described below. It should be noted that the controller 180 may be a central processing unit (CPU) which loads a program and executes predetermined processing, or may be an integrated circuit which is programmed to perform predetermined functionality.

Next, the basic operation of the clean stocker 100 configured as set forth above will be described.

First, when storing a pod containing a reticle into the clean stocker 100, the overhead traveling vehicle carries the pod containing the reticle into the OHT auto load port 150 or the operator carries the pod containing the reticle into the manual load port 160. Next, the pod containing the reticle carried in the clean stocker 100 is transferred to the pod opener 140 by the pod carrier device 130, and separated into the reticle and the empty pod. Then, the reticle is housed in the rotating rack 111 for reticle by the reticle carrier device 120, and the empty pod is housed in the rotating rack 112 for empty pod by the pod carrier device 130.

On the other hand, when retrieving the pod containing the reticle from the clean stocker 100, the reticle carrier device 120 transfers a reticle to be retrieved, from the rotating rack 111 for reticle to the pod opener 140, and the pod carrier device 130 transfers an empty pod from the rotating rack 112 for empty pod to the pod opener 140. The reticle carried in the pod opener 140 is housed into the empty pod, transferred to the OHT auto load port 150 or the manual load port 160 by the pod carrier device 130, and retrieved from the clean stocker 100.

Figure 4:
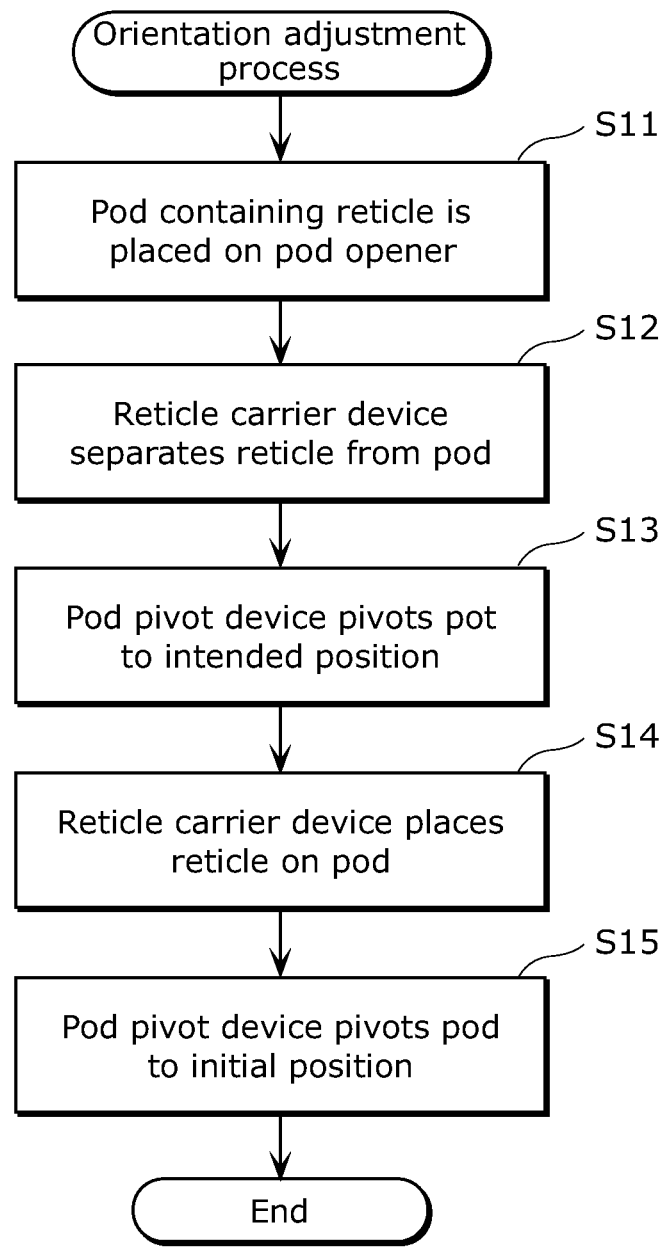
FIG. 4 is a flowchart illustrating an orientation adjustment process.

Next, referring to FIG. 4 to FIG. 9, an orientation adjustment process of adjusting a relative orientation between a reticle and a pod will be described, with reference to the reticle carrier device 120, the pod carrier device 130, and the pod opener 140. FIG. 4 is a flowchart illustrating the orientation adjustment process. Each process step illustrated in FIG. 4 is controlled by the controller 180 that is programmed to perform the steps described below.

First, the pod containing the reticle is placed on the pod opener 140 (S11). For example, a reticle 230 to be retrieved is transferred from the rotating rack 111 for reticle to the pod opener 140 by the reticle carrier device 120, a pod 200 which is empty is transferred from the rotating rack 112 for empty pod to the pod opener 140 by the pod carrier device 130, and the reticle 230 is housed in the pod 200 in the pod opener 140.

Figure 5:
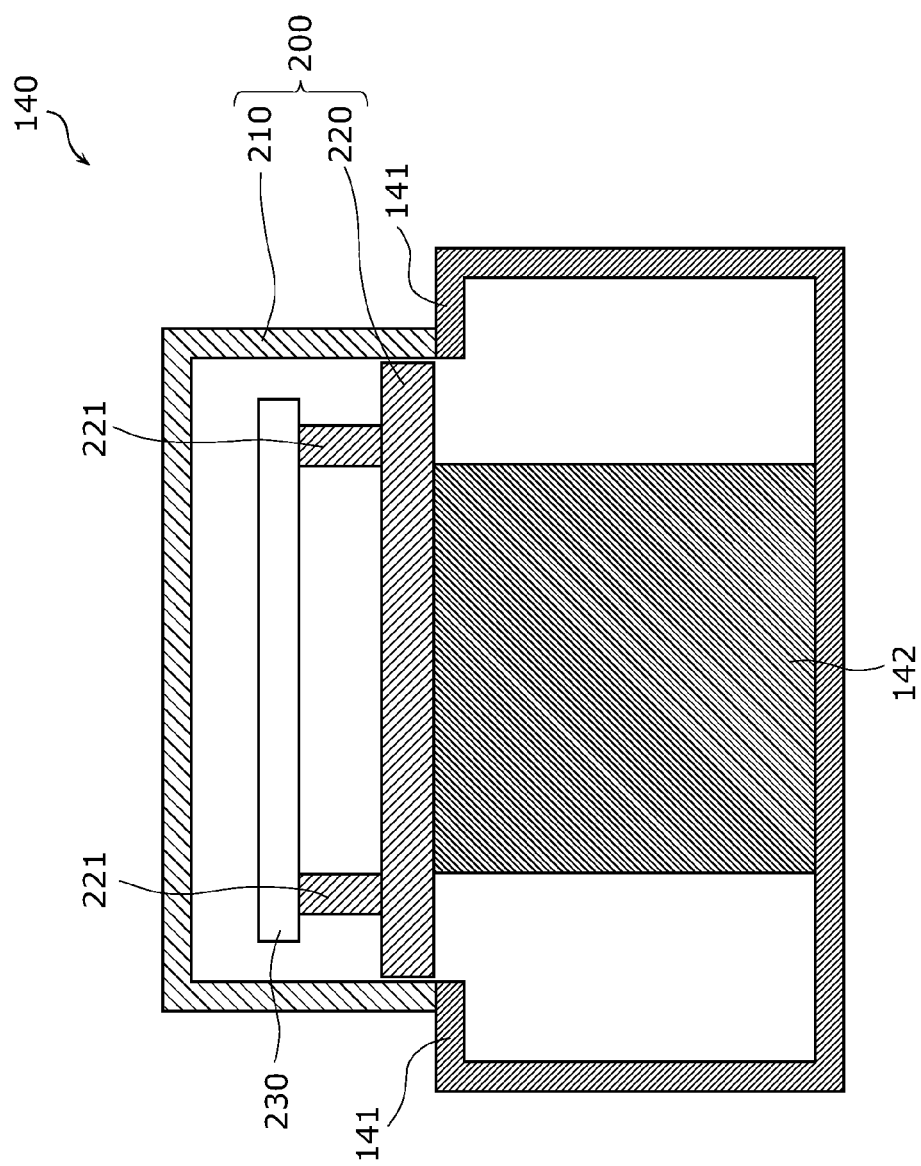
FIG. 5 is a side view of the interior of a pod opener, showing a state in S11.

Referring to FIG. 5, details of the pod opener 140 and the pod 200 will be described. FIG. 5 is a side view of the interior of the pod opener 140, showing a state in S11 of FIG. 4.

The pod 200 includes a cover 210 and a door 220 which are vertically separable. The pod 200 supports the reticle 230 via a plurality of projections 221 projecting from a top surface of the door 220, and houses the reticle 230 therein by covering the reticle 230 by the cover 210.

The pod opener 140 includes a lock unit 141 which locks the cover 210, and the placing unit 142 which on which the door 220 is placed. Additionally, the placing unit 142 serves as an ascending and descending device which ascends and descends in a state in which the door 220 is placed on the ascending and descending device, and also serves as a pivot device which pivots in the horizontal plane.

The pod opener 140 has an opening on a top surface. Then, the lock unit 141 is disposed on a circumference of the opening. The placing unit 142 is disposed in the interior of the pod opener 140, located facing the opening in the top surface. The top surface of the pod opener 140 and a placement surface (a top surface) of the placing unit 142 are located on the same plane when the placing unit 142 has fully risen. Then, the pod 200 is placed on the placing unit 142 which has fully risen. This closes the opening of the pod opener 140 by the pod 200.

Figure 6:
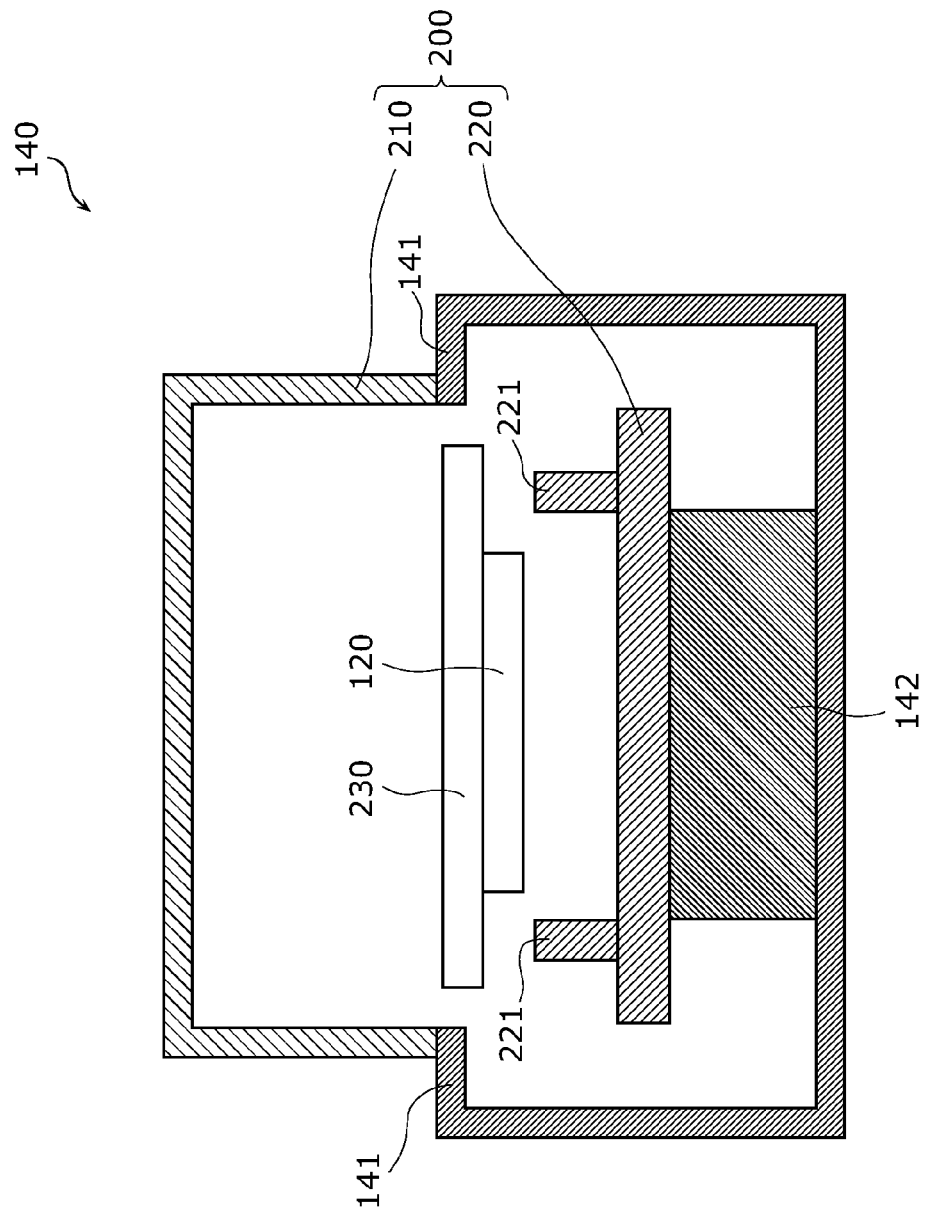
FIG. 6 is a side view of the interior of the pod opener, showing a state in S12.

FIG. 6 is a side view of the interior of the pod opener 140, showing a state in S12 of FIG. 4. As shown in FIG. 6, when the placing unit 142 having the pod 200 placed thereon descends, the door 220 descends together with the placing unit 142, the cover 210 is locked by the lock unit 141, thus separating the cover 210 and the door 220.

Then, by ascending and descending along with the ascending and descending guide 127 in a state where the reticle carrier device 120 is holding the reticle 230, the reticle carrier device 120 as the holding device holds the reticle 230 in a holding position separate by a predetermined distance above the door 220 (S12). Here, it is assumed that the reticle carrier device 120 is holding the reticle 230 without changing the orientation of the reticle 230.

Figure 7:
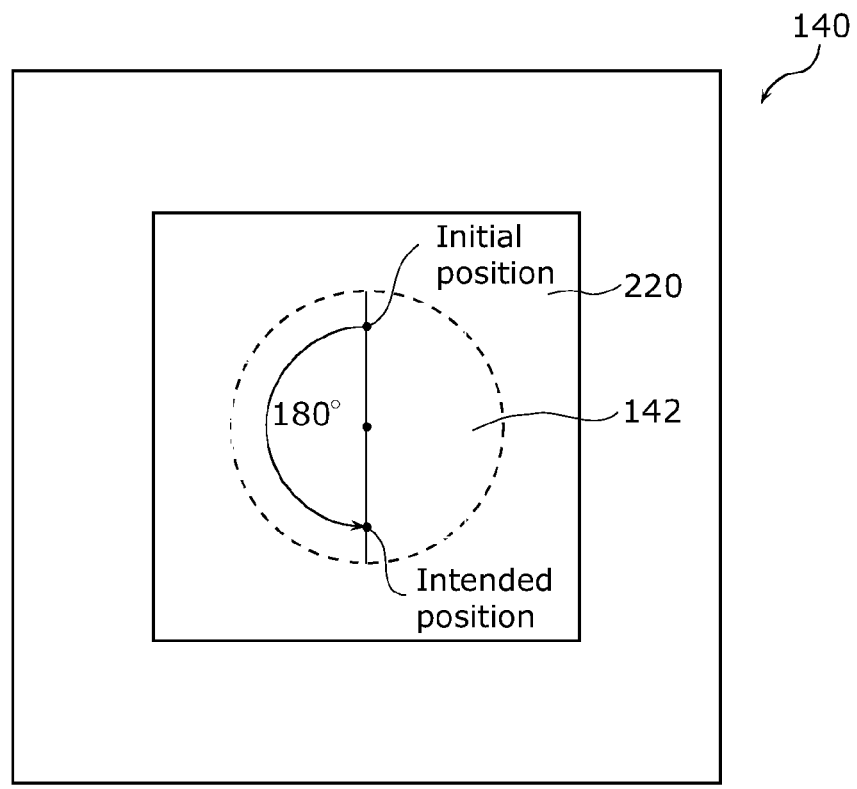
FIG. 7 is a plan view of the interior of the pod opener, showing a state in S13.

FIG. 7 is a plan view of the interior of the pod opener 140, showing a state in S13 of FIG. 4. As shown in FIG. 7, the placing unit 142 as the pivot device pivots the door 220 separated from the reticle 230, from an initial position to an intended position (S13). While a pivot angle between the initial position and the intended position is not particularly limited, the placing unit 142 pivots the door 220 preferably by 180 degrees counterclockwise, for example.

Figure 8:
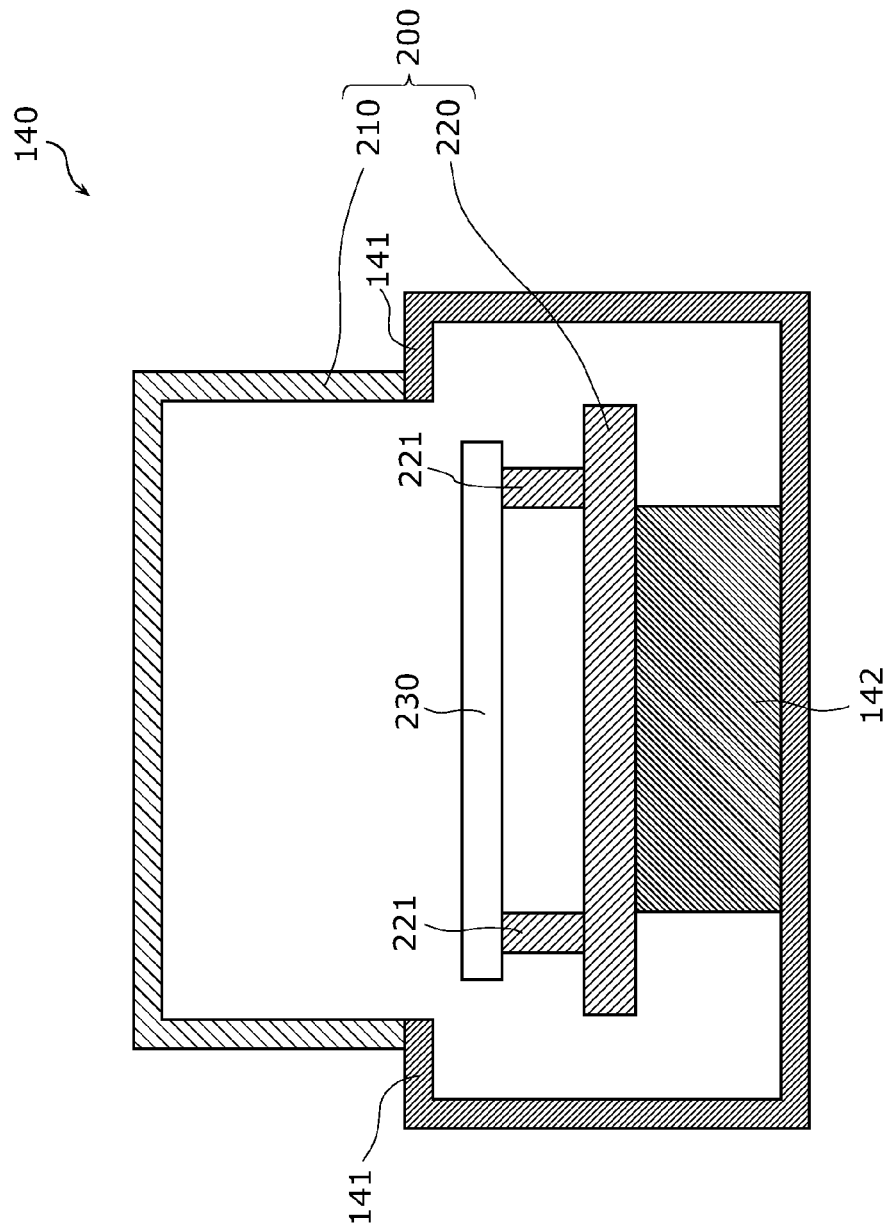
FIG. 8 is a side view of the interior of the pod opener, showing a state in S14.

FIG. 8 is a side view of the interior of the pod opener 140, showing a state in S14 of FIG. 4. As shown in FIG. 8, by descending along with the ascending and descending guide 127, the reticle carrier device 120 places the reticle 230 on the door 220 pivoted to the intended position. Here, since the door 220 is pivoted by the placing unit 142, a relative orientation between the reticle 230 and the door 220 has changed while the reticle 230 is held without the reticle carrier device 120 changing the orientation of the reticle 230.

Figure 9:
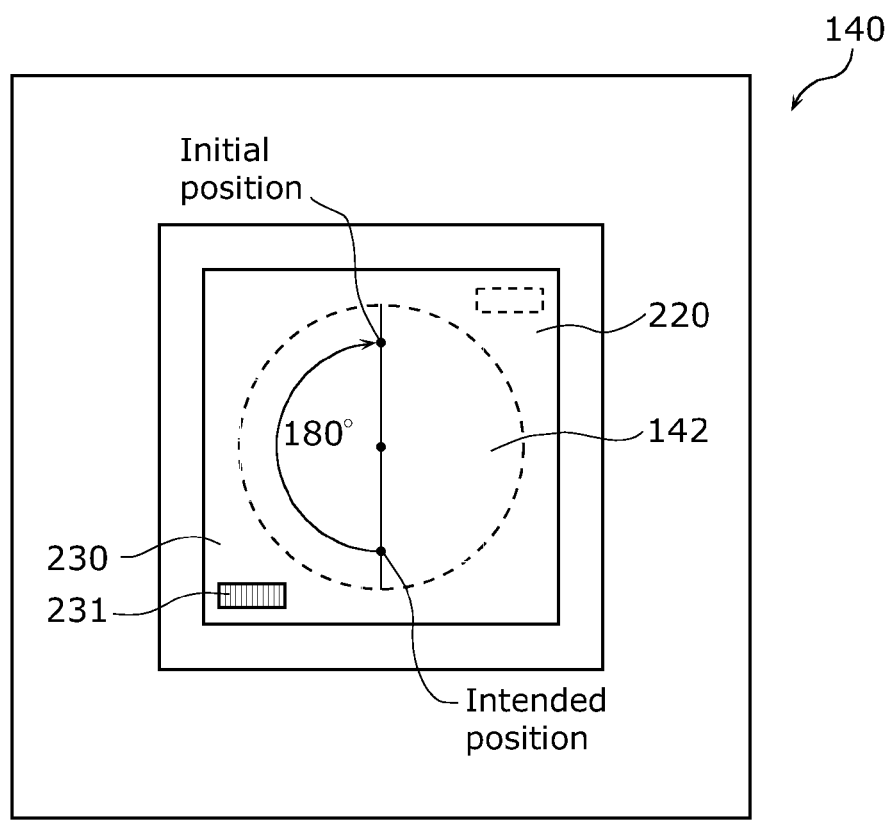
FIG. 9 is a plan view of the interior of the pod opener, showing a state in S15.

FIG. 9 is a plan view of the interior of the pod opener 140, showing a state in S15 of FIG. 4. The placing unit 142 pivots the door 220 having the reticle 230 placed thereon from the intended position to the initial position (S15). Specifically, in the above example, the placing unit 142 pivots the door 220 preferably by 180 degrees clockwise. This pivots the reticle 230 together with the door 220 so that a marker 231 located at the lower left corner of the reticle 230 moves to the upper right corner (a position indicated by a dashed box). It should be noted that the marker 231 may be any device which can identify the orientation of the reticle 230, and may be a barcode to identify the reticle 230, for example.

According to the above method, the relative orientation between the reticle 230 and the pod 200 is adjustable in the pod opener 140. In other others, since there is no need to remove the reticle 230 and the pod 200 from the pod opener 140 and transfer them elsewhere, an amount of cycle time required for the transfer can be reduced. As a result, the relative orientation between the reticle 230 and the pod 200 can be adjusted in a short time and with a few steps.

It should be noted that in S12 and S13 of FIG. 4, the placing unit 142 may start pivoting after the reticle carrier device 120 ascends to the holding position in a state in which the reticle carrier device 120 is holding the reticle 230. From a viewpoint of further reducing processing time for the orientation adjustment process, however, the controller 180 may cause the placing unit 142 to start pivoting the door 220 from the initial position to the intended position after the reticle 230 is separated from the door 220 by the reticle carrier device 120 and before the reticle 230 reaches the holding position.

Alternatively, the clean stocker 100 may further include an orientation verification device (not shown) which verifies the relative orientation between the reticle 230 and the door 220. Then, the controller 180 may cause the orientation verification device to verify the relative orientation between the reticle 230 and the door 220 after the door 220 is pivoted to the initial position by the placing unit 142.

More specifically, the orientation verification device may include a camera which captures an image of the reticle 230 from above. Then, after S15 of FIG. 4, the reticle carrier device 120 may remove the reticle 230 from the pod 200, and the orientation verification device may capture an image of the reticle 230 and verify whether the marker 231 is at a predetermined position.

While in the above preferred embodiment, the relative orientation between the reticle 230 and the pod 200 preferably is adjusted in the clean stocker 100, the present invention is not limited thereto. A preferred embodiment of the present invention includes, for example, a reticle orientation adjustment device which is independently installed outside of the clean stocker 100 and adjusts the relative orientation between the reticle 230 and the pod 200.

Furthermore, the present invention is not limited to a device which adjusts the relative orientation between the reticle 230 and the pod 200, and also includes an orientation adjustment device which adjusts a relative orientation between any article and a placing base on which the article is placed. For example, a preferred embodiment of the present invention may adjust a relative orientation between a liquid crystal panel and a pallet on which the liquid crystal panel is placed.

Although illustrative preferred embodiments of the present invention have been described herein with reference to the accompanying drawings, it is to be understood that the invention is not limited the those precise preferred embodiments, and that various other changes and modifications may be affected therein without departing from the scope or spirit of the inventions.

Preferred embodiments of the present invention are advantageously utilized in orientation adjustment devices that adjust a relative orientation between an article and a placing base on which the article is placed.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An orientation adjustment device for adjusting a relative orientation between an article and a placing base when a direction in which the article is inserted into an external device is predetermined and a direction in which the placing base having the article placed thereon is inserted into the external device is predetermined, the orientation adjustment device comprising:
 a pivot device arranged to pivot the placing base;
 a holding device arranged to hold the article above the placing base without changing an orientation of the article; and
 a controller arranged and programmed to control the pivot device and the holding device to adjust the relative orientation between the article and the placing base to a predetermined orientation; wherein
 the controller is programmed to control:
  the holding device to hold the article in a state in which the article is spaced upwardly from the placing base held by the pivot device;
  the pivot device to pivot the placing base in the state in which the article is spaced from the placing base, from an initial position to an intended position;
  the holding device to place the article, which has been held above the placing base, on the placing base which has been pivoted to the intended position; and
  the pivot device to pivot the placing base having the article placed thereon from the intended position to the initial position.

2. The orientation adjustment device according to claim 1, wherein the holding device vertically moves, holding the article, and holds the article in a holding position upwardly spaced by a predetermined distance from the placing base.

3. The orientation adjustment device according to claim 2, wherein the controller is programmed to control the pivot device to start pivoting the placing base from the initial position to the intended position after the article is separated from the placing base by the holding device and before the article reaches the holding position.

4. An orientation adjustment method for adjusting a relative orientation between an article and a placing base, executed by an orientation adjustment device including a pivot device that pivots a placing base, and a holding device that holds the article above the placing base without changing an orientation of the article when a direction in which the article is inserted into an external device is predetermined and a direction in which the placing base having the article placed thereon is inserted into the external device is predetermined, the orientation adjustment method comprising the steps of:
 holding, by the holding device, the article in a state in which the article is spaced upwardly from the placing base held by the pivot device;
 pivoting, by the pivot device, the placing base in the state in which the article is spaced from the placing base, from an initial position to an intended position; and
 placing, by the holding device, the article, which has been held above the placing base, on the placing base which has been pivoted to the intended position; and
 pivoting, by the pivot device, the placing base having the article placed thereon from the intended position to the initial position.

* * * * *